US010971473B2

(12) United States Patent
Kosaka

(10) Patent No.: US 10,971,473 B2
(45) Date of Patent: Apr. 6, 2021

(54) SEMICONDUCTOR DEVICE

(71) Applicant: TOSHIBA MEMORY CORPORATION, Minato-ku (JP)

(72) Inventor: Yoshiyuki Kosaka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 18 days.

(21) Appl. No.: 16/285,855

(22) Filed: Feb. 26, 2019

(65) Prior Publication Data

US 2020/0075543 A1    Mar. 5, 2020

(30) Foreign Application Priority Data

Aug. 31, 2018   (JP) .............................. JP2018-163200

(51) Int. Cl.
*H01L 25/065*   (2006.01)
*H01L 23/31*    (2006.01)
(Continued)

(52) U.S. Cl.
CPC ........ *H01L 25/0652* (2013.01); *H01L 23/293* (2013.01); *H01L 23/3128* (2013.01); *H01L 24/32* (2013.01); *H01L 24/33* (2013.01); *H01L 24/48* (2013.01); *H01L 24/73* (2013.01); *H01L 25/18* (2013.01); *H01L 23/5383* (2013.01); *H01L 23/5386* (2013.01); *H01L 2224/2919* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48145* (2013.01); *H01L 2224/48227* (2013.01); *H01L 2224/73215* (2013.01); *H01L 2224/73265* (2013.01); *H01L 2225/0651* (2013.01); *H01L 2225/06506* (2013.01); *H01L 2225/06548* (2013.01); *H01L 2225/06562* (2013.01); *H01L 2225/06575* (2013.01);
(Continued)

(58) Field of Classification Search
CPC ......................... H01L 25/0652; H01L 23/293; H01L 23/3128
See application file for complete search history.

(56) References Cited

U.S. PATENT DOCUMENTS 7,407,608 B2   8/2008   Miyajima et al.
8,564,093 B2   10/2013  Kuroda
(Continued)

FOREIGN PATENT DOCUMENTS

JP   2006-134917   5/2006
JP   2010-045166   2/2010

*Primary Examiner* — Douglas M Menz
(74) *Attorney, Agent, or Firm* — Oblon, McClelland, Maier & Neustadt, L.L.P.

(57) ABSTRACT

According to one embodiment, a semiconductor device includes a substrate, first stacked components, second stacked components, and a coating resin. The first stacked components include first chips and are stacked on a surface of the substrate. The second stacked components include second chips and are stacked on the surface. The coating resin covers the surface, the first stacked components, and the second stacked components. A first top surface of a second farthest one of the first chips away from the surface differs in position in a first direction from a second top surface of second farthest one of the second chips away from the surface.

7 Claims, 9 Drawing Sheets

(51) Int. Cl.
   *H01L 25/18*   (2006.01)
   *H01L 23/00*   (2006.01)
   *H01L 23/29*   (2006.01)
   *H01L 23/538*  (2006.01)

(52) U.S. Cl.
   CPC .............. *H01L 2225/06586* (2013.01); *H01L 2924/0635* (2013.01); *H01L 2924/0665* (2013.01); *H01L 2924/1438* (2013.01)

(56) References Cited

U.S. PATENT DOCUMENTS

| | | | |
|---|---|---|---|
| 8,729,689 B2* | 5/2014 | Hwang | H01L 23/3128 |
| | | | 257/686 |
| 2017/0170156 A1* | 6/2017 | Hong | H01L 25/0657 |
| 2018/0122771 A1* | 5/2018 | Park | H01L 25/0652 |
| 2018/0342481 A1* | 11/2018 | Lee | H01L 24/85 |
| 2019/0295917 A1* | 9/2019 | Kim | H01L 23/4334 |
| 2019/0326223 A1* | 10/2019 | Lee | H01L 24/19 |
| 2019/0341369 A1* | 11/2019 | Chang Chien | H01L 23/5386 |

* cited by examiner

SEMICONDUCTOR DEVICE

CROSS-REFERENCE TO RELATED APPLICATIONS

This application is based upon and claims the benefit of priority from Japanese Patent Application No. 2018-163200, filed on Aug. 31, 2018; the entire contents of which are incorporated herein by reference.

FIELD

Embodiments described herein relate generally to a semiconductor device.

BACKGROUND

The semiconductor device includes a substrate and a plurality of semiconductor chips stacked on the substrate. The stacked chips are connected by, for example, bonding wires to each other and to the substrate.

In one semiconductor device, a plurality of chips stacked on a substrate and another plurality of chips stacked on the substrate may be arranged side by side. In this case, the semiconductor device may increase in size in a direction intersecting with a stacking direction.

DETAILED DESCRIPTION

In general, according to one embodiment, a semiconductor device includes a substrate, a plurality of first stacked components, a plurality of first wires, a plurality of second stacked components, a plurality of second wires, and a coating resin. The substrate includes a surface facing in a first direction and a plurality of electrodes on the surface. The plurality of first stacked components includes a plurality of first chips, and is stacked on the surface. The plurality of first wires connects the plurality of first chips and the plurality of electrodes. The plurality of second stacked components includes a plurality of second chips, and is stacked on the surface. The plurality of second wires connects the plurality of second chips and the plurality of electrodes. The coating resin covers the surface, the plurality of first stacked components, the plurality of first wires, the plurality of second stacked components, and the plurality of second wires, and includes an outer surface that faces in the first direction and is provided with a recess that forms a mark. The plurality of first stacked components including the plurality of first chips each includes a first top surface facing in the first direction. The plurality of second stacked components including the plurality of second chips each includes a second top surface facing in the first direction. The first top surface of a second farthest one of the plurality of first chips away from the surface differs in position in the first direction from the second top surface of a second farthest one of the plurality of second chips away from the surface. The recess is located on the outer surface outside a region lying over either of the first top surface and the second top surface in the first direction, whichever is farther from the surface, the first top surface being of a farthest one of the plurality of first stacked components away from the surface, and the second top surface being of a farthest one of the plurality of second stacked components away from the surface.

First Embodiment

A first embodiment is described below with reference to FIG. 1. In the specification, constituent elements according to embodiments and descriptions of the constituent elements may be expressed in plural form. The constituent elements and their descriptions are not limited to expressions in the specification. The constituent elements may be identified from names different from those in the specification. Moreover, the constituent elements may be described in expressions different from the expressions in the specification.

Figure 1:
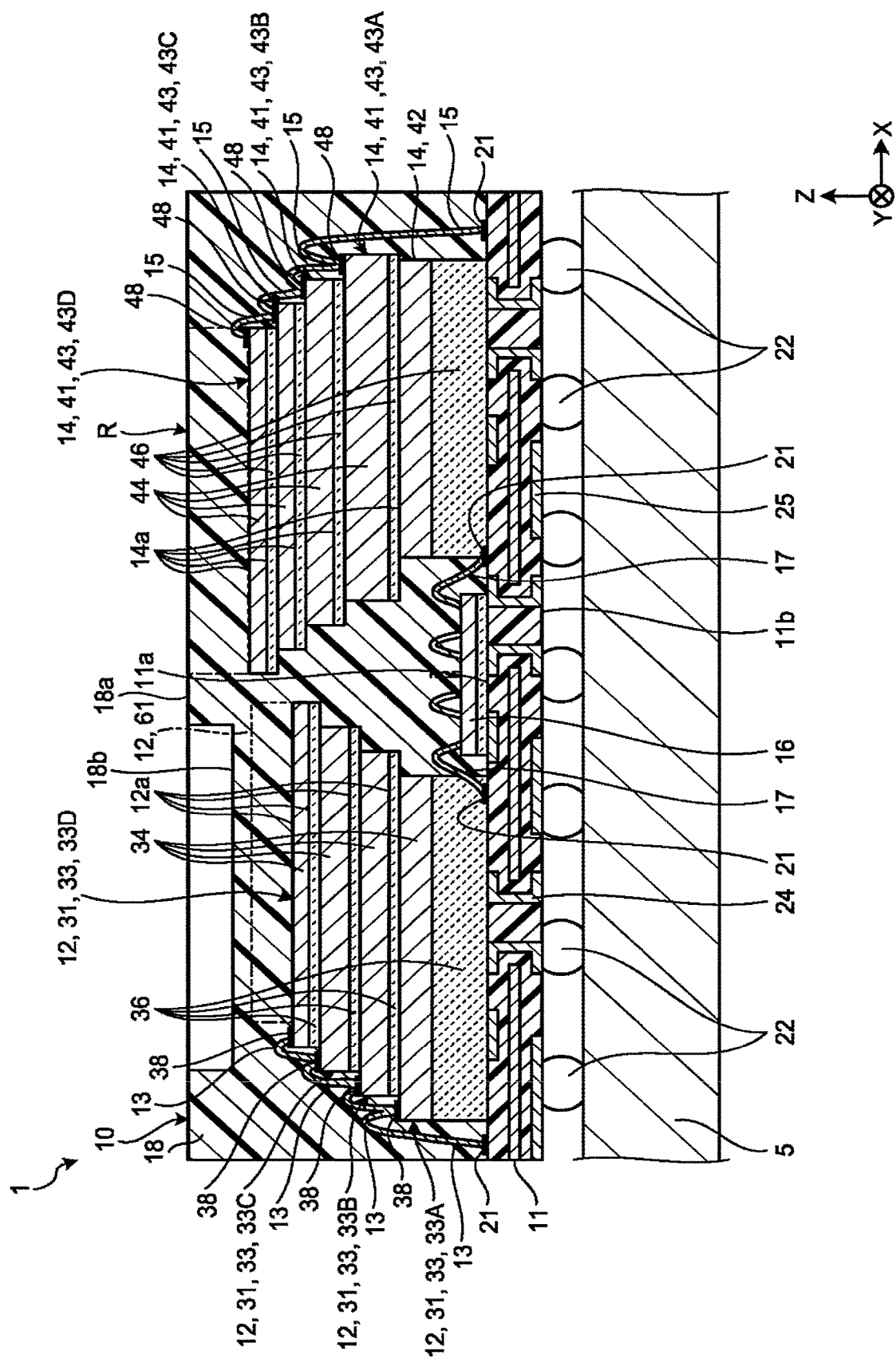
FIG. 1 is a cross-sectional view schematically illustrating part of an electronic apparatus according to a first embodiment.

FIG. 1 is a cross-sectional view schematically illustrating part an electronic apparatus according to the first embodiment. The electronic apparatus 1 is mounted on a smartphone, for example. The electronic apparatus 1 may be mounted on, for example, a personal computer, a portable computer, a tablet, a mobile phone, a television set, a hard disk drive (HDD), a solid state drive (SSD), a USB flash drive, an SD card, an eMMC (registered trademark), a universal flash storage (UFS), a memory card, another storage apparatus, a wearable device, a smart speaker, a home electric appliance, or another apparatus.

As illustrated in FIG. 1, the electronic apparatus 1 includes a circuit board 5 and a semiconductor device 10. The circuit board 5 is, for example, a printed circuit board (PCB). The semiconductor device 10 is mounted on the circuit board 5. Furthermore, other devices such as a central processing unit (CPU) that controls the electronic apparatus 1 may be mounted on the circuit board 5.

The semiconductor device 10 as one example of the embodiment is a ball grid array (BGA) semiconductor package. The semiconductor device 10 may have another structure, or may be a semiconductor package of another specification such as a land grid array (LGA).

As illustrated in the drawing, the X-axis, the Y-axis, and the Z-axis are defined in the specification. The X-axis, the Y-axis, and the Z-axis are orthogonal to one another. The X-axis is along the width of the semiconductor device 10.

The Y-axis is along the length (depth) of the semiconductor device 10. The Z-axis is along the height (thickness) of the semiconductor device 10.

The semiconductor device 10 includes a substrate 11, a plurality of first stacked components 12, a plurality of first wires 13, a plurality of second stacked components 14, a plurality of second wires 15, a controller chip 16, a plurality of third wires 17, and a sealing resin 18. The sealing resin 18 is an example of coating resin.

The substrate 11 is, for example, a printed wiring board (PWB). The substrate 11 includes a first surface 11a and a second surface 11b. The first surface 11a is an example of a surface. The first surface 11a is a substantially flat surface facing in a positive direction of the Z-axis (a direction pointed by an arrow of the Z-axis). The positive direction of the Z-axis is an example of a first direction, and may also be referred to as the stacking direction. The second surface 11b is a substantially flat surface that is located opposite to the first surface 11a and faces in a negative direction of the Z-axis (a direction opposite to the arrow of the Z-axis).

The substrate 11 further includes a plurality of pads 21. The pad 21 is an example of an electrode, and may also be referred to as, for example, a land. The pads 21 are provided on the first surface 11a of the substrate 11. A part excluding the pads 21 of the first surface 11a is produced from, for example, solder resist. On the other hand, the second surface 11b of the substrate 11 is provided with a plurality of solder balls 22.

The plurality of pads 21 and the plurality of solder balls 22 are electrically connected to each other through, for example, vias 24 and wires 25, which are provided to the substrate 11. At least one pad 21 may be electrically connected to another pad 21, and electrically separated from the solder ball 22. The solder balls 22 are electrically connected to lands provided on the circuit board 5. Consequently, the semiconductor device 10 is mounted on the circuit board 5.

The plurality of first tacked components 12 includes a plurality of first chips 31. The plurality of first chips 31 includes a plurality of first memory chips 33. In the embodiment, all the first stacked components 12 are the first chips 31, and all the first chips 31 are the first memory chips 33. The first chip 31 may include a chip different from the first memory chip 33, such as a controller chip.

The first memory chip 33 is, for example, a NAND flash memory, and stores information. The first memory chip 33 may be another memory chip such as a NOR flash memory. The first memory chip 33 includes a silicon substrate (silicon wafer) 34 being a layer produced from a material including silicon (Si). Silicon is an example of an inorganic material.

The plurality of first stacked components 12 including the plurality of first memory chips 33 are stacked on the first surface 11a of the substrate 11. In the embodiment, four first stacked components 12 (first chips 31/first memory chips 33) are stacked on the first surface 11a. The number of the first stacked components 12 is not limited to this example.

For description, the four first memory chips 33 may be individually referred to below as the first memory chips 33A, 33B, 33C, and 33D. In terms of descriptions common to the four first memory chips 33, they are referred to as the first memory chip 33 and described.

Each of the plurality of first stacked components 12 including the plurality of first chips 31 (first memory chips 33) includes a substantially flat first top surface 12a facing in the positive direction of the Z-axis. In other words, each of the plurality of first memory chips 33 includes the first top surface 12a. If the plurality of first stacked components 12 includes another chip and/or another component, each of the other chip and the other component also includes the first top surface 12a.

In the specification, expressions indicating directions such as up and down are used with reference to the drawings such as FIG. 1 for convenience of description. In other words, names and descriptions, which use the expressions such as up and down, do not limit positions and directions of constituent elements of the electronic apparatus 1. For example, the first top surface 12a may face down in the vertical direction.

Each of the plurality of first memory chips 33 is provided with a first bonding layer 36. The first bonding layer 36 is a die attach film (DAF), and is produced from, for example, a material including an acrylic polymer and an epoxy resin. Die attach film may also be referred to as a die bonding film. The first bonding layer 36 may be, for example, an adhesive.

The first bonding layer 36 provided to the first memory chip 33A bonds the first memory chip 33A and the first surface 11a of the substrate 11 together. In other words, one of a plurality of the first bonding layers 36 is placed between the first memory chip 33A and the first surface 11a of the substrate 11.

The first bonding layer 36 provided to the first memory chip 33B bonds the first memory chip 33B and the first top surface 12a of the first memory chip 33A together. The first bonding layer 36 provided to the first memory chip 33C bonds the first memory chip 33C and the first top surface 12a of the first memory chip 33B together. The first bonding layer 36 provided to the first memory chip 33D bonds the first memory chip 33D and the first top surface 12a of the first memory chip 33C together. In other words, the plurality of the first bonding layers 36 is placed between the plurality of first memory chips 33.

In the embodiment, the first bonding layer 36 provided to the first memory chip 33A is thicker than each of the first bonding layers 36 provided to the first memory chips 33B, 33C, and 33D. In other words, the distance between the first surface 11a of the substrate 11 and the first memory chip 33A is longer than the distance between the plurality of first memory chips 33.

As described above, the first bonding layer 36 bonds between one of the plurality of first memory chips 33 and the first surface 11a of the substrate 11, or between the plurality of first memory chips 33. Consequently, the plurality of first memory chips 33 is stacked on the first surface 11a of the substrate 11.

Each of the plurality of first memory chips 33 (first chips 31) includes a first terminal 38 provided on the first top surface 12a. The first terminal 38 may be provided to another part of the first memory chip 33.

In the embodiment, the first terminal 38 is provided at an end of the first top surface 12a in a negative direction of the X-axis (a direction opposite to an arrow of the X-axis). The plurality of first memory chips 33 is stacked in such a manner that the first terminal 38 is exposed. In other words, the first memory chips 33B, 33C, and 33D are bonded to parts of the first top surfaces 12a outside the first terminals 38. Hence, the plurality of first memory chips 33 is stacked in step form that increases in length in a positive direction of the X-axis (a direction pointed by the arrow, of the X-axis) with increasing number of the first memory chips 33.

One end of the first wire 13 is connected to the first terminal 38 of the corresponding first memory chip 33. The other end of the first wire 13 is connected to the first terminal 38 of another corresponding first memory chip 33, or the pad 21 of the substrate 11. Consequently, the plurality of first wires 13 electrically connects the plurality of first memory chips 33 (first chips 31) and the plurality of pads 21.

The first terminal 38 of the first memory chip 33 is placed in the positive direction of the Z-axis on another first memory chip 33 or the first surface 11a of the substrate 11, on which the first memory chip 33 is stacked. Consequently, when the first wire 13 is attached to the first terminal 38 by wire bonding, the above-mentioned other first memory chip 33 or substrate 11 can support the first memory chip 33 stably.

Furthermore, the center of gravity of the first memory chip 33 is placed in the positive direction of the Z-axis on another first memory chip 33 or the first surface 11a of the substrate 11, on which the first memory chip 33 is stacked. Consequently, the above-mentioned other first memory chip 33 or substrate 11 can support the first memory chip 33 stably.

In the embodiment, the first memory chip 33D is thinner than each of the first memory chips 33A, 33B, and 33C. The thicknesses of the first memory chips 33A, 33B, and 33C are substantially equal to one another. The thicknesses of the first memory chips 33 are not limited to this example. Differences in the thicknesses of the first memory chips 33 are set by, for example, the grinding of the silicon substrates 34.

The plurality of second stacked components 14 includes a plurality of second chips 41 and a spacer 42. The plurality of second chips 41 includes a plurality of second memory chips 43. In the embodiment, all the second chips 41 are the second memory chips 43. The second chips 41 may include a chip different from the second memory chip 43, such as a controller chip.

The second memory chip 43 is, for example, a NAND flash memory, and stores information. The second memory chip 43 may be another memory chip. The second memory chip 43 includes a silicon substrate 44 being a layer produced from a material including silicon.

The plurality of second stacked components 14 including the plurality of second memory chips 43 is stacked on the first surface 11a of the substrate 11 at a position away in the positive direction of the X-axis from the plurality of first stacked components 12. In the embodiment, five second stacked components 14 including four second chips 41 (second memory chips 43) and one spacer 42 are stacked on the first surface 11a. The plurality of second stacked components 14 is different in number from the plurality of first stacked components 12. The number of the second stacked components 14 is not limited to this example.

The four second memory chips 43 may be individually referred to below as the second memory chips 43A, 43B, 43C, and 43D for description. In terms of descriptions common to the four second memory chips 43, they are referred to as the second memory chip 43 and described.

Each of the plurality of second stacked components 14 including the plurality of second chips 41 (second memory chips 43) and the spacer 42 includes a substantially flat second top surface 14a facing in the positive direction of the Z-axis. In other words, each of the plurality of second memory chips 43 and the spacer 42 includes the second top surface 14a. If the plurality of second stacked components 14 includes another chip and/or another component, each of the other chip and the other component also includes the second top surface 14a.

Each of the spacer 42 and the plurality of second memory chips 43 is provided with a second bonding layer 46. The second bonding layer 46 is an example of a bonding layer, and is a die attach film (DAF). The second bonding layer 46 may be, for example, an adhesive.

The second bonding layer 46 provided to the spacer 42 bonds the spacer 42 as the second stacked component 14 and the first surface 11a of the substrate 11 together. In other words, one of a plurality of the second bonding layers 46 is placed between the spacer 42 and the first surface 11a of the substrate 11.

The second bonding layer 46 provided to the second memory chip 43A bonds the second memory chip 43A and the second top surface 14a of the spacer 42 together. The spacer 42 supports the second memory chip 43A.

The second bonding layer 46 provided to the second memory chip 43B bonds the second memory chip 43B and the second top surface 14a of the second memory chip 43A together. The second bonding layer 46 provided to the second memory chip 43C bonds the second memory chip 43C and the second top surface 14a of the second memory chip 43B together. The second bonding layer 46 provided to the second memory chip 43D bonds the second memory chip 43D and the second top surface 14a of the second memory chip 43C together. In other words, the plurality of the second bonding layers 46 is placed between the plurality of second memory chips 43.

In the embodiment, the second bonding layer 46 provided to the spacer 42 is thicker than the second bonding layers 46 provided to the plurality of second memory chips 43. In other words, the distance between the first surface 11a of the substrate 11 and the spacer 42 is longer than the distance between the spacer 42 and the second memory chip 43 and is longer than the distance between the plurality of second memory chips 43.

As described above, the second bonding layer 46 bonds between the spacer 42 and the first surface 11a of the substrate 11, between the spacer 42 and one of the plurality of second memory chips 43, or between the plurality of second memory chips 43. Consequently, the plurality of second memory chips 43 is stacked on the first surface 11a of the substrate 11.

Each of the plurality of second memory chips 43 (second chips 41) includes a second terminal 48 provided on the second top surface 14a. The second terminal 48 is an example of a terminal. The second terminal 48 may be provided to another part of the second memory chip 43.

In the embodiment, the second terminal 48 is provided at an end of the second top surface 14a in the positive direction of the X-axis. The plurality of second memory chips 43 is stacked in such a manner that the second terminal 48 is exposed. In other words, the second memory chips 43B, 43C, and 43D are bonded to parts of the second top surfaces 14a outside the second terminals 48. Hence, the plurality of second memory chips 43 is stacked in step form that increases in length in the negative direction of the X-axis with increasing number of the second memory chips 43. In other words, the plurality of second memory chips 43 is stacked in step form that approaches the plurality of first stacked components 12.

One end the second wire 15 is connected to the second terminal 48 of the corresponding second memory chip 43. The other end of the second wire 15 is connected to the second terminal 48 of another corresponding second memory chip 43, or the pad 21 of the substrate 11. Consequently, the plurality of second wires 15 connects the plurality of second memory chips 43 (second chips 41) and the plurality of pads 21.

The second terminal 48 of the second memory chip 43 is placed over another second memory chip 43 or the spacer 42, on which the second memory chip 43 is stacked, in the positive direction of the Z-axis. Consequently, when the second wire 15 is attached to the second terminal 48 by wire bonding, the above-mentioned other second memory chip 43 or spacer 42 can support the second memory chip 43 stably.

Furthermore, the center of gravity of the second memory chip 43 is placed in the positive direction of the axis on another second memory chip 43 or the spacer 42, on which the second memory chip 43 is stacked. Consequently, the above-mentioned other second memory chip 43 or spacer 42 can support the second memory chip 43 stably.

The spacer 42 is located between the second memory chip 43A and the first surface 11a of the substrate 11. The plurality of second stacked components 14 may further include the spacer 42 located between the plurality of second memory chips 43.

In the embodiment, the spacer 42 is produced from, for example, silicon used for semiconductor manufacturing. In other words, the material of the spacer 42 and the material of the first memory chip 33 and the second memory chip 43 both include silicon. The spacer 42 may be produced from another material.

In the embodiment, the second memory chip 43A is thicker than the second memory chips 43B, 43C, and 43D. The second memory chips 43C and 43D are thinner than the second memory chips 43A and 43B. The thicknesses of the second memory chips 43C and 43D are substantially equal to each other. The thicknesses of the second memory chips 43 are not limited to this example. Differences in the thicknesses of the second memory chips 43 are set by, for example, the grinding of the silicon substrates 44.

The second memory chip 43A is thicker than each of the first memory chips 33A, 33B, 33C, and 33D. Furthermore, each of the second memory chips 43C and 43D is thinner than each of the first memory chips 33A, 33B, and 33C. In this manner, the thickness of one of the plurality of first chips 31 is different from the thickness of one of the plurality of second chips 41.

The first top surfaces 12a of the first memory chips 33A, 33B, 33C, and 33D are at positions different in the positive direction of the Z-axis from the second top surfaces 14a of the corresponding second memory chips 43A, 43B, 43C, and 43D. In other words, the first top surface 12a of the n-th first memory chip 33 of the plurality of stacked first memory chips 33, and the second top surface 14a of the n-th second memory chip 43 of the plurality of stacked second memory chips 43 are at different positions in the positive direction of the Z-axis.

For example, the first top surface 12a of the first memory chip 33C that is the second farthest one of the plurality of first memory chips 33 away from the first surface 11a is differs in position in the positive direction of the Z-axis from the second top surface 14a of the second memory chip 43C that is the second farthest one of the plurality of second memory chips 43 away from the first surface 11a. Hence, the first memory chip 33D stacked on the first memory chip 33C is at a different position in the positive direction of the Z-axis from the second memory chip 43D stacked on the second memory chip 43C.

In the embodiment, the second top surfaces 14a of the second memory chips 43A, 43B, 43C, and 43D are farther in the positive direction of the Z-axis from the first surface 11a of the substrate 11 than the first top surfaces 12a of the corresponding first memory chips 33A, 33B, 33C, and 33D. In other words, the second top surfaces 14a of the second memory chips 43A, 43B, 43C, and 43D are upward than the first top surfaces 12a of the corresponding first memory chips 33A, 33B, 33C, and 33D. The second top surface 14a of the second memory chip 43D being a farthest one of the plurality of second stacked components 14 away from the first surface 11a, is farther from the first surface 11a than the first top surface 12a of the first memory chip 33D being a farthest one of the plurality of first stacked components 12 away from the first surface 11a.

The first top surfaces 12a of the first memory chips 33A and 33D and the second top surfaces 14a of the second memory chips 43A and 43B may be at the same positions in the positive direction of the Z-axis.

The controller chip 16 controls, for example, storage and reading of the plurality of first memory chips 33 and the plurality of second memory chips 43. The controller chip 16 may control not limited to the first memory chips 33 and the second memory chips 43 but other electronic components included in the semiconductor device 10.

In the embodiment, the controller chip 16 is mounted on the first surface 11a of the substrate 11. The controller chip 16 is located between the plurality of first stacked components 12 and the plurality of second stacked components 14, in the X-axis direction. The controller chip 16 may be placed at another position.

The plurality of third wires 17 connects the controller chip 16 and the plurality of pads 21 on the first surface 11a. In this manner, the controller chip 16 is electrically connected to the wires (circuit) of the substrate 11 by wire bonding. The controller chip 16 may be mounted on the first surface 11a by not limited to this example but another method such as flip chip mounting.

At least one of the plurality of third wires 17 is partially embedded in the first bonding layer 36 that bonds the first memory chip 33A to the first surface 11a of the substrate 11. Furthermore, at least one of the plurality of third wires 17 is partially embedded in the second bonding layer 46 that bonds the spacer 42 to the first surface 11a of the substrate 11.

As described above, the first bonding layer 36 between the first memory chip 33A and the first surface 11a is relatively thick. Moreover, the second bonding layer 46 between the spacer 42 and the first surface 11a is relatively thick. Hence, the third wire 17 embedded in the first bonding layer 36 or the second bonding layer 46 is spaced apart from the first memory chip 33A or the spacer 42.

Each of the first bonding layer 36 and the second bonding layer 46 has electrical insulating properties. Hence, the first bonding layer 36 prevents a short-circuit between the plurality of third wires 17 and, for example, the first memory chips 33.

The sealing resin 18 is produced from, for example, a synthetic resin including an epoxy resin in which inorganic matter such as silicon dioxide is mixed. The sealing resin 18 may be produced from a material including another synthetic resin. The sealing resin 18 seals and covers the first surface 11a of the substrate 11, the plurality of first stacked components 12, the plurality of first wires 13, the plurality of second stacked components 14, the plurality of second wires 15, the controller chip 16, and the plurality of third wires 17.

The plurality of first stacked components 12, the plurality of first wires 13, the plurality of second stacked components 14, the plurality of second wires 15, the controller chip 16, and the plurality of third wires 17 are embedded in the sealing resin 18. In another expression, the plurality of first stacked components 12, the plurality of first wires 13, the plurality of second stacked components 14, the plurality of second wires 15, the controller chip 16, and the plurality of third wires 17 are housed in the sealing resin 18, and are in the sealing resin 18.

The sealing resin 18 includes a substantially flat outer surface 18a facing in the positive direction of the Z-axis. The outer surface 18a is provided with a recess 18b. The recess 18b is formed by, for example, cutting the outer surface 18a with a laser beam. The recess 18b may be formed by another method.

The recess 18b forms a mark on the outer surface 18a. The mark is, for example, a mark related to the traceability of the semiconductor device 10 such as number, a letter, a barcode, or a two-dimensional barcode or a mark related to a seller or standard with which the semiconductor device 10 is complied. The mark formed by the recess 18b is not limited to these examples.

The recess 18b is located on the outer surface 18a outside a region R lying over the second top surface 14a of the second memory chip 43D in the positive direction of the Z-axis. In another expression, in a plan view in the positive direction of the axis, the recess 18b is located outside the second top surface 14a of the second memory chip 43D. FIG. 1 illustrates the region R schematically partitioned by chain double-dashed lines.

The second memory chip 43D is a farthest one of the plurality of second memory chips 43 away from the first surface 11a of the substrate 11. The second top surface 14a of the second memory chip 43D is farther from the first surface 11a than the first top surface 12a of the first memory chip 33D is.

The first top surface 12a of the first memory chip 33D that is the farthest away from the first surface 11a among the plurality of first stacked components 12 may be farther from the first surface 11a than the second top surface 14a of the second memory chip 43D that is the farthest away from the first surface 11a among the plurality of second stacked components 14 is. In this case, the recess 18b is located on the outer surface 18a outside a region lying over the first top surface 12a of the first memory chip 33D in the positive direction of the Z-axis.

The distance between the first chip 31 (the first memory chip 33) of the first stacked component 12 and the second chip 41 (the second memory chip 43) of the second stacked component 14 is set to be longer than a predetermined distance. Consequently, interference (contact) between the first chip 31 and the second chip 41 is prevented.

In the embodiment, the distance in the X-axis direction between the first memory chip 33D and the second memory chip 43D may be shorter than the predetermined distance. However, the distance between the first memory chip 33D and the second memory chip 43D is longer than the predetermined distance in a three-dimensional space. Hence, interference between the first memory chip 33D and the second memory chip 43D is prevented.

The predetermined distance is set in such manner as to, for example, be able to prevent interference between the first memory chip 33 and the second memory chip 43 resulting from manufacturing tolerances and cause the sealing resin 18 to pass a space between the first memory chip 33 and the second memory chip 43.

In the embodiment, the first memory chip 33D and the second memory chip 43D is spaced apart in the X-axis direction. However, the first memory chip 33D and the second memory chip 43D may overlap in the positive direction of the Z-axis.

The semiconductor device 10 according to the first embodiment has been described above. Generally, when chips are mounted on a substrate by wire bonding, bonding wires are connected to connection terminals. Accordingly, the chips are stacked stepwise. Hence, when a plurality of chips are stacked, an area for mounting increases in a direction (for example, the X-axis direction) intersecting with the positive direction of the Z-axis with increasing number of chips, which may lead to an increase in the size of a semiconductor device. On the other hand, in the embodiment, the first top surface 12a of the first memory chip 33C that is the second farthest one of the plurality of first chips 31 away from the first surface 11a of the substrate 11 differs in position in the positive direction of the Z-axis from the second top surface 14a of the second memory chip 43C that is the second farthest one of the plurality of second chips 41 away from the first surface 11a. Therefore, the first memory chip 33D that is the farthest one away from the first surface 11a can differ in position in the positive direction of the Z-axis from the second memory chip 43D that is the farthest one away from the first surface 11a. Hence, it is possible to bring the plurality of first chips 31 close to the plurality of second chips 41 in the direction intersecting with the positive direction of the Z-axis while providing a predetermined distance between the first chip 31 and the second chip 41 in a three-dimensional space. Therefore, it is possible to reduce the size of the semiconductor device 10 in the direction intersecting with the positive direction of the Z-axis and increase the area where components can be mounted on the circuit board 5.

Furthermore, in the embodiment, the recess 18b that forms a mark is created on the outer surface 18a of the sealing resin 18 by a laser beam. Generally, a predetermined distance is provided between an outer surface of a sealing resin and a chip to prevent the influence of the heat of the laser beam. On the other hand, in the embodiment, the recess 18b is located on the outer surface 18a outside the region R lying over either of the first top surface 12a and the second top surface 14a in the positive direction of the Z-axis, whichever is farther from the first surface 11a, the first top surface 12a being of a farthest one (the first memory chip 33D) of the plurality of first stacked components 12 away from the first surface 11a, and the second top surface 14a being of a farthest one (the second memory chip 43D) of the plurality of second stacked components 14 away from the first surface 11a. Consequently, for example, it is possible to maintain a predetermined distance between the recess 18b and the first top surface 12a closer to the first surface 11a, and to bring the second top surface 14a farther from the first surface 11a close to the outer surface 18a. Therefore, there is no need to provide a long distance between the second top surface 14a and the outer surface 18a, and the size of the semiconductor device 10 can be reduced in the positive direction of the Z-axis.

The plurality of first stacked components 12 is different in number from the plurality of second stacked components 14. Consequently, the position of the first top surface 12a of the first memory chip 33C that is the second farthest away from the first surface 11a among the plurality of first chips 31 and the position of the second top surface 14a of the second memory chip 43C that is the second farthest away from the first surface 11a among the plurality of second chips 41 can be easily made different in the positive direction of the Z-axis.

One of the plurality of first chips 31 is different in thickness from one of the plurality of second chips 41. Consequently, the position of the first top surface 12a of the first memory chip 33C that is the second farthest away from the first surface 11a among the plurality of first chips 31 and the position of the second top surface 14a of the second memory chip 43C that is the second farthest away from the first surface 11a among the plurality of second chips 41 can be easily made different in the positive direction of the Z-axis.

One second bonding layer 46 bonds the spacer 42 of the plurality of second stacked components 14 and the first surface 11a together. At least part of the third wire 17 connecting the controller chip 16 and the pad 21 is embedded in the second bonding layer 46. Consequently, even if the controller chip 16 is arranged side by side with the second stacked component 14 in the direction intersecting with the positive direction of the Z-axis, the interference of the third wire 17 with the second stacked component 14 is prevented. Therefore, it is possible to bring the controller chip 16 and the second stacked component 14 close to each other in the direction intersecting with the positive direction of the Z-axis and reduce the size of the semiconductor device 10 in the direction intersecting with the Z-axis.

The plurality of second stacked components 14 includes the spacer 42 located between the second memory chip 43A of the plurality of the second chips 41 and the first surface 11a. Consequently, the position of the first top surface 12a of the first memory chip 33C that is the second farthest away from the first surface 11a among the plurality of first chips 31 and the position of the second top surface 14a of the second memory chip 43C that is the second farthest away from the first surface 11a among the plurality of second chips 41 can be easily made different in the positive direction of the Z-axis.

The second memory chip 43A of the plurality of second chips 41 is supported by the spacer 42 and includes the second terminal 48 connected to one of the plurality of second wires 15. The second terminal 48 is placed over the spacer 42 in the positive direction of the Z-axis. The spacer 42 supports the second terminal 48 when the second wire 15 is connected to the second terminal 48. Accordingly, the work of connecting the second wire 15 to the second terminal 48 is stabilized.

At least one of the plurality of first chips 31 and the plurality of second chips 41 includes the silicon substrates 34 and 44 produced from a material including an inorganic material being the material of the spacer 42. Consequently, it is possible to achieve commonality of the materials of the silicon substrates 34 and 44 and the spacer 42, and reduce the manufacturing cost of the semiconductor device 10.

Second Embodiment

A second embodiment is described below with reference to FIG. 2. In the following descriptions of embodiments, the same reference numerals as constituent elements having similar functions to the constituent elements that have already been described are assigned to the above-described constituent elements. Furthermore, their description may be omitted. Moreover, all functions and properties of constituent elements to which the same reference numeral is assigned are not necessarily common, and the constituent elements may have different functions and properties in accordance with the embodiment.

Figure 2:
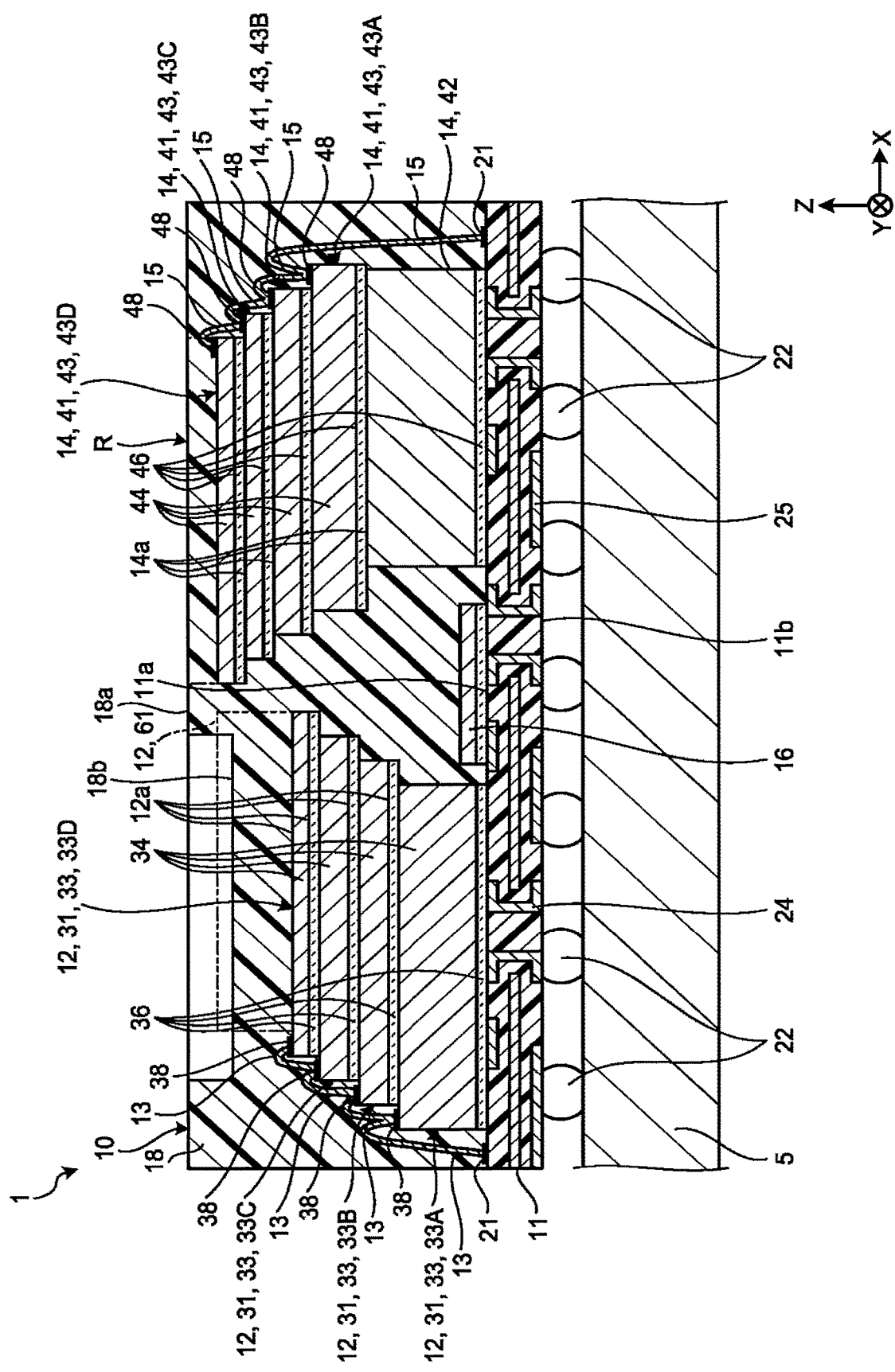
FIG. 2 is a cross-sectional view schematically illustrating part an electronic apparatus according to a second embodiment.

FIG. 2 is a cross-sectional view schematically illustrating part of the electronic apparatus 1 according to the second embodiment. As illustrated in FIG. 2, in the second embodiment, the controller chip 16 is mounted on the substrate 11 by flip chip mounting instead of wire bonding with the third wires 17.

In the second embodiment, the first memory chip 33A is thicker than each of the first memory chips 33B, 33C, and 33D. Furthermore, the spacer 42 is thicker than each of the second memory chips 43A, 43B, 43C, and 43D, and is thicker than each of the first memory chips 33A, 33B, 33C, and 33D.

On the other hand, the thickness of the first bonding layer 36 provided to the first memory chip 33A is substantially equal to the thickness of the first bonding layer 36 provided to each of the first memory chips 33B, 33C, and 33D. Furthermore, the thickness of the second bonding layer 46 provided to the spacer 42 is substantially equal to the thickness of the second bonding layer 46 provided to each of the second memory chips 43A, 43B, 43C, and 43D.

In the semiconductor device 10 of the second embodiment described above, the controller chip 16 is mounted on the first surface 11a of the substrate 11 by flip chip mounting. Consequently, it is possible to prevent interference (contact) of the third wire 17 with the first stacked component 12 and the second stacked component 14 and bring the first stacked component 12 and the second stacked component 14 close to the controller chip 16 in the direction intersecting with the positive direction of the Z-axis. Therefore, the size of the semiconductor device 10 can be reduced in the direction intersecting with the Z-axis.

Third Embodiment

Figure 3:
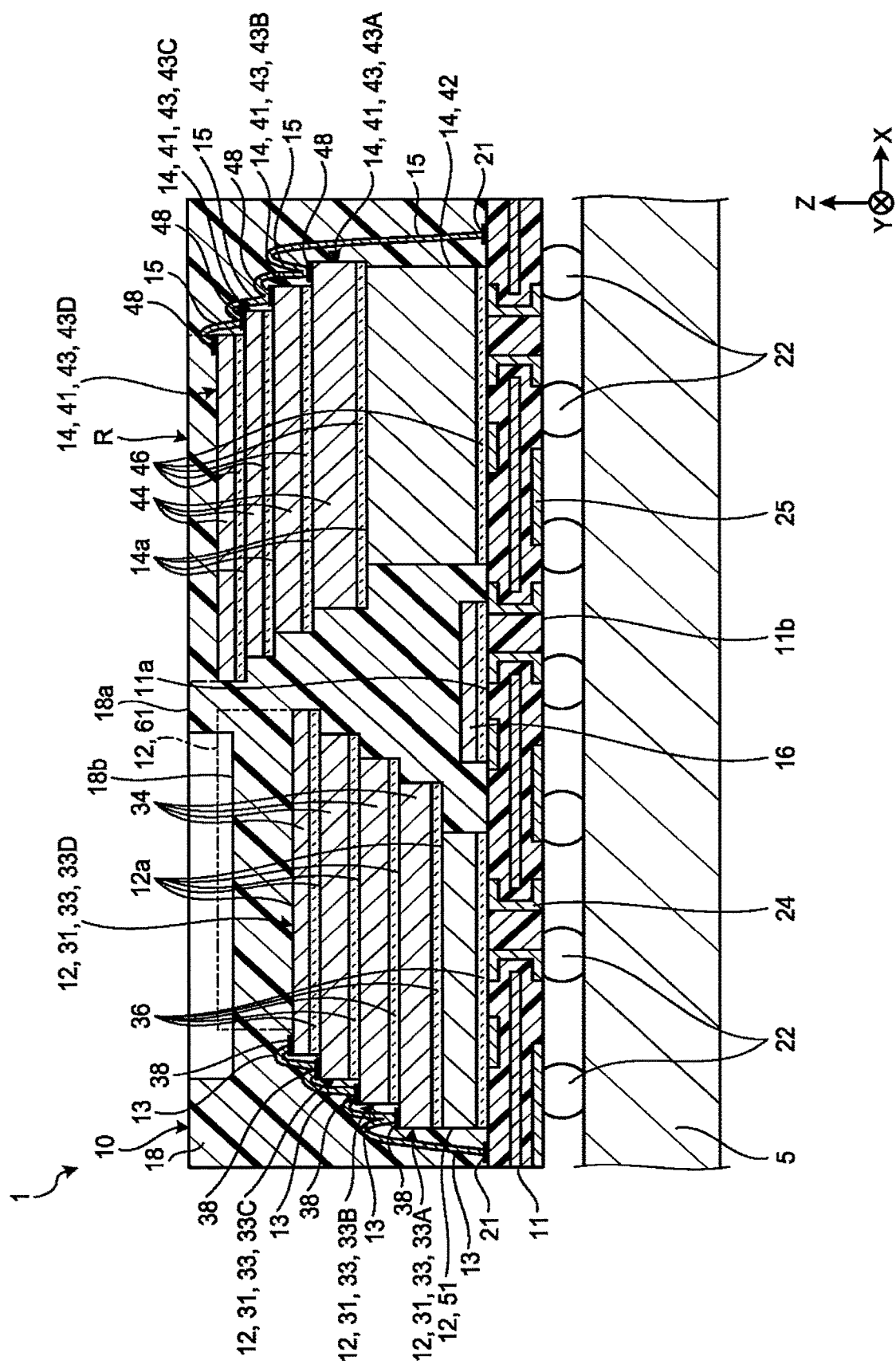
FIG. 3 is a cross-sectional view schematically illustrating part of an electronic apparatus according to a third embodiment.

A third embodiment is described below with reference to FIG. 3. FIG. 3 is a cross-sectional view schematically illustrating part of the electronic apparatus 1 according to the third embodiment. As illustrated in FIG. 3, the controller chip 16 and tree plurality of second tacked components 14 are equivalent to those of the second embodiment.

In the third embodiment, the plurality of first stacked components 12 include a spacer 51. In other words, five first stacked components 12 including four first chips 31 (first memory chips 33) and one spacer 51 are stacked on the first surface 11a. Hence, the plurality of first stacked components 12 match in number with the plurality of second stacked components 14. The spacer 51 is produced from silicon as in the spacer 42. The spacer 51 is one of the first stacked components 12 and includes the first top surface 12a.

Each of the plurality of first memory chips 33 and the spacer 51 is provided with the first bonding layer 36. The first bonding layer 36 provided to the spacer 51 bonds the spacer 51 and the first surface 11a of the substrate 11. In other words, one of the plurality of first bonding layers 36 is placed between the spacer 51 and the first surface 11a. The first bonding layer 36 provided to the first memory chip 33A bonds the first memory chip 33A and the first top surface 12a of the spacer 51 together.

The thickness of the first memory chip 33A is substantially equal to the thickness of each of the first memory chips 33B and 33C, and is greater than the thickness of the first memory chip 33D. The thickness of the spacer 51 is substantially equal to the thickness of each of the first memory chips 33A, 33B, and 33C, and is greater than the thickness of the first memory chip 33D. The thickness of the spacer 51 is less than the thickness of the spacer 42. Furthermore, the thickness of the first bonding layer 36 provided to the spacer 51 is substantially equal to the thickness of the first bonding layer 36 provided to each of the first memory chips 33A, 33B, 33C, and 33D.

In the semiconductor device 10 of the third embodiment described above, the plurality of first stacked components 12 include the spacer 51. The thickness of the spacer 51 of the plurality of first stacked components 12 is less than the thickness of the spacer 42 of the plurality of second stacked components 14. Consequently, the position of the first top surface 12a of the first memory chip 33C that is the second farthest away from the first surface 11a among the plurality of first chips 31 and the position of the second top surface 14a of the second memory chip 43C that is the second farthest away from the first surface 11a among the plurality of second chips 41 can be easily made different in the positive direction of the Z-axis.

Fourth Embodiment

Figure 4:
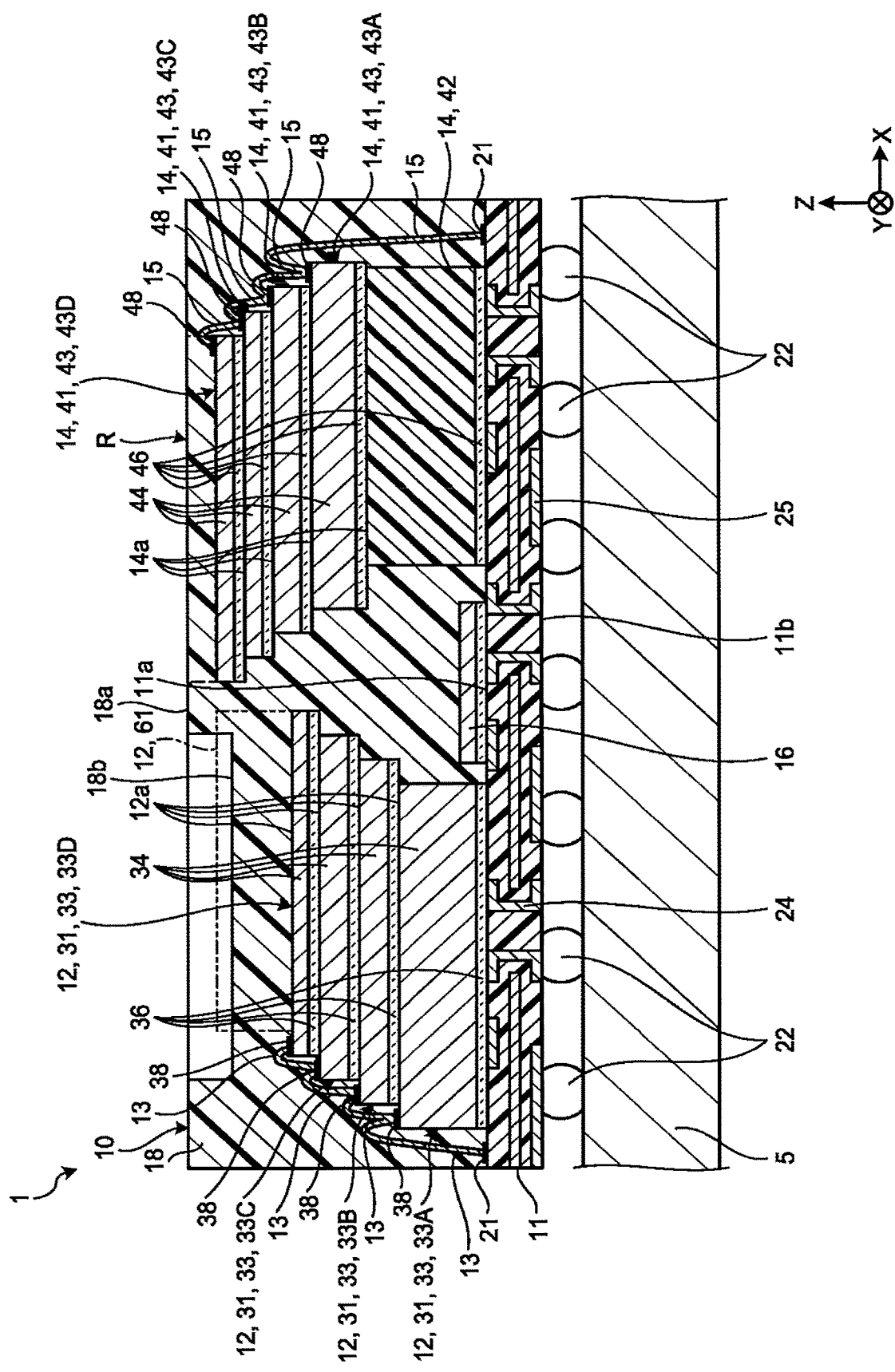
FIG. 4 is a cross-sectional view schematically illustrating part of an electronic apparatus according to a fourth embodiment.

A fourth embodiment is described below with reference to FIG. 4. FIG. 4 is a cross-sectional view schematically illustrating part of the electronic apparatus 1 according to the fourth embodiment. The fourth embodiment is different from the second embodiment in the material of the spacer 42.

In the fourth embodiment, the spacer 42 is produced from a synthetic resin including an epoxy resin in which inorganic matter such as silicon dioxide is mixed. In other words, the spacer 42 and the sealing resin 18 are both produced from a synthetic resin. The spacer 51 of the third embodiment may be produced from a synthetic resin.

In the semiconductor device 10 of the fourth embodiment described above, the spacer 42 is produced from a synthetic resin being the material of the sealing resin 18. Consequently, it is possible to achieve commonality of the materials of the spacer 42 and the sealing resin 18 and reduce the manufacturing cost of the semiconductor device 10.

Fifth Embodiment

Figure 5:
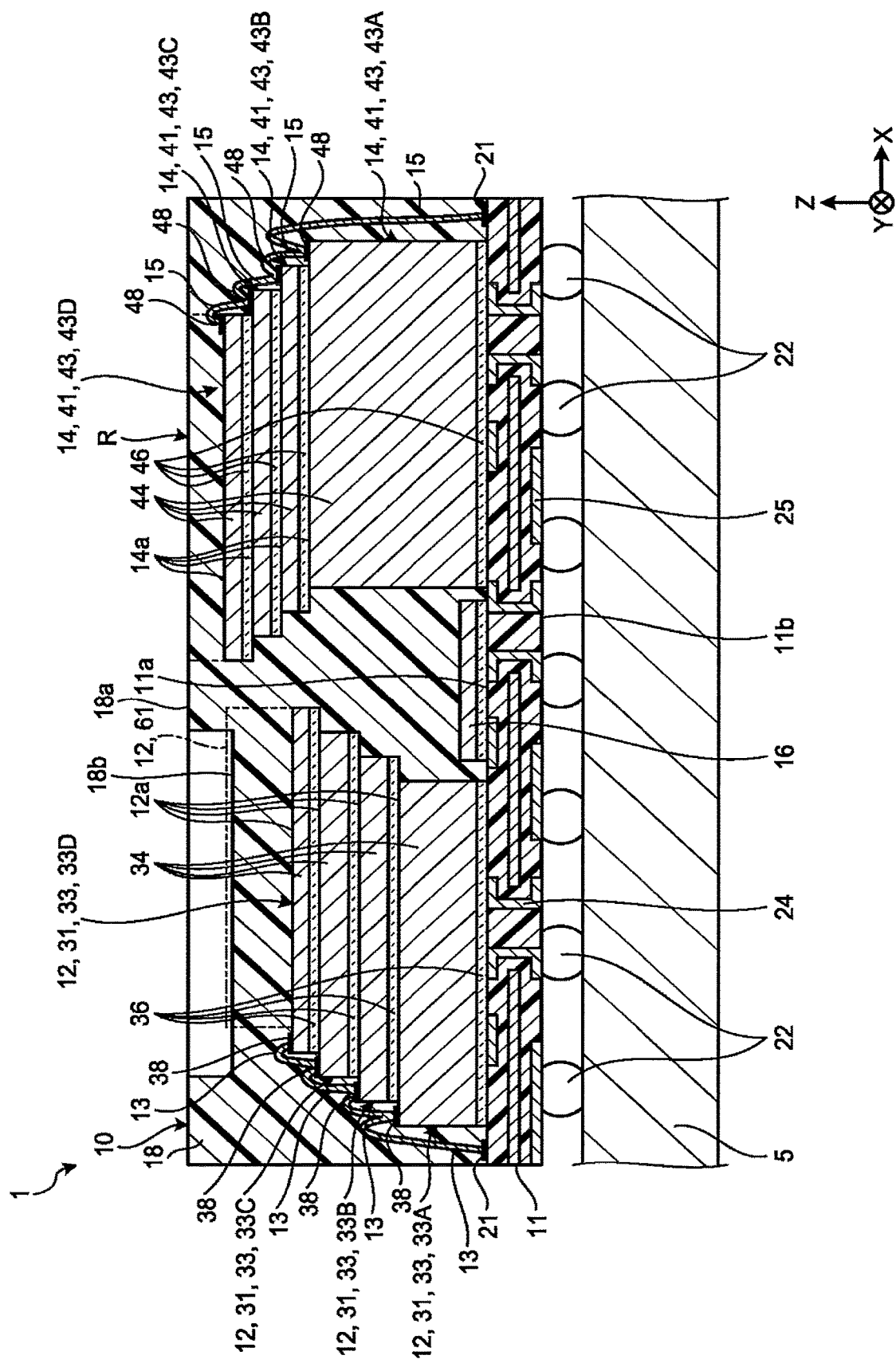
FIG. 5 is a cross-sectional view schematically illustrating part of an electronic apparatus according to a fifth embodiment.

A fifth embodiment is described below with reference to FIG. 5. FIG. 5 is a cross-sectional view schematically illustrating part of the electronic apparatus 1 according to the fifth embodiment. As illustrated in FIG. 5, the controller chip 16 and the plurality of first stacked components 12 are equivalent to those of the second embodiment.

In the fifth embodiment, the plurality of second stacked components 14 includes four second chips 41 (second memory chips 43) and does not include the spacer 42. Hence, the plurality of first stacked components 12 match in number with the plurality of second stacked components 14.

The second bonding layer 46 provided to the second memory chip 43A bonds the second memory chip 43A and the first surface 11a of the substrate 11 together. The second memory chip 43A is thicker than each of the second memory chips 43B, 43C, and 43D, and is thicker than each of the first memory chips 33A, 33B, 33C, and 33D.

In the semiconductor device 10 of the fifth embodiment described above, the number of the plurality of first stacked components 12 is equal to the number of the plurality of second stacked components 14. Consequently, the position of the first top surface 12a of the first memory chip 33C that is the second farthest away from the first surface 11a among the plurality of first chips 31 and the position of the second top surface 14a of the second memory chip 43C that is the second farthest away from the first surface 11a among the plurality of second chips 41 can be made different in the positive direction of the Z-axis without increasing the number of components.

The first memory chip 33A is thicker than each of the first memory chips 33B, 33C, and 33D. The second memory chip 43A is thicker than each of the second memory chips 43B, 43C, and 43D, and is thicker than the first memory chip 33A.

In this manner, the plurality of first stacked components 12 and the plurality of second stacked components 14 include a plurality of types of the first chips 31 and the second chips 41, which are different in thickness. Consequently, the position of the first top surface 12a of the first memory chip 33C that is the second farthest away from the first surface 11a among the plurality of first chips 31 and the position of the second top surface 14a of the second memory chip 43C that is the second farthest away from the first surface 11a among the plurality of second chips 41 can be easily made different in the positive direction of the Z-axis.

Sixth Embodiment

Figure 6:
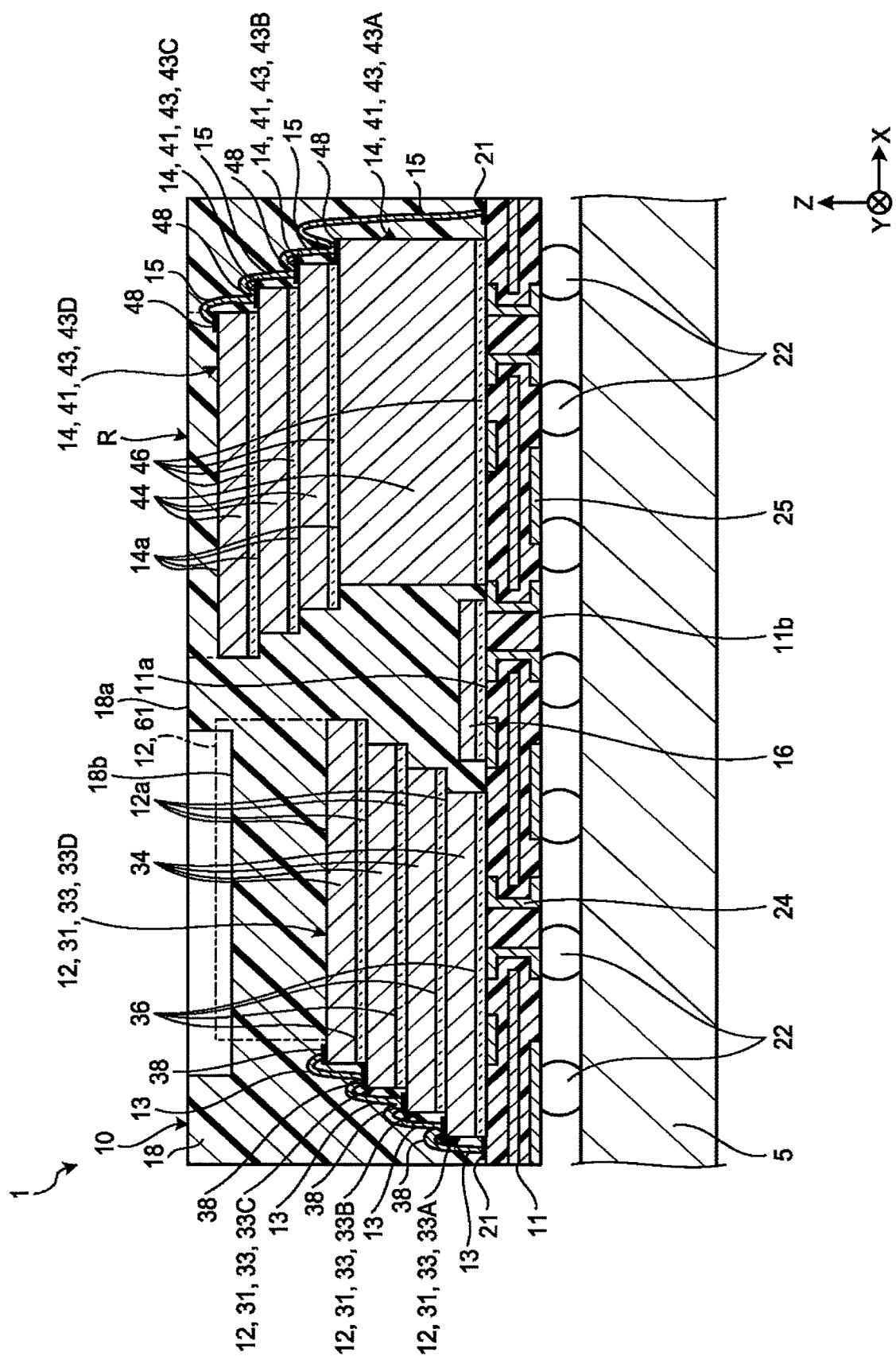
FIG. 6 is a cross-sectional view schematically illustrating part of an electronic apparatus according to a sixth embodiment.

A sixth embodiment is described below with reference to FIG. 6. FIG. 6 is a cross-sectional view schematically illustrating part of the electronic apparatus 1 according to the sixth embodiment. The sixth embodiment is different from the fifth embodiment in the thicknesses of the first chip 31 and the second chip 41.

In the sixth embodiment, as illustrated in FIG. 6, the thicknesses of the plurality of first memory chips 33A, 33B, 33C, and 33D are equal to one another. The thicknesses of the plurality of second memory chips 43B, 43C, and 43D are equal to one another.

The thickness of each of the first memory chips 33A, 33B, 33C, and 33D is equal to the thickness of each of the plurality of second memory chips 43B, 43C, and 43D. On the other hand, the second memory chip 43A is thicker than each of the first memory chips 33A, 33B, 33C, and 33D and is thicker than each of the plurality of second memory chips 43B, 43C, and 43D.

In the semiconductor device 10 of the sixth embodiment described above, the plurality of first stacked components 12 and the plurality of second stacked components 14 include the first memory chips 33A, 33B, 33C, and 33D and the second memory chips 43B, 43C, and 43D, which are equal in thickness to one another, and the second memory chip 43A thicker than the other memory chips. Consequently, it is possible to reduce the types of the first chips 31 and the second chips 41 and reduce the cost of the semiconductor device 10.

Seventh Embodiment

Figure 7:
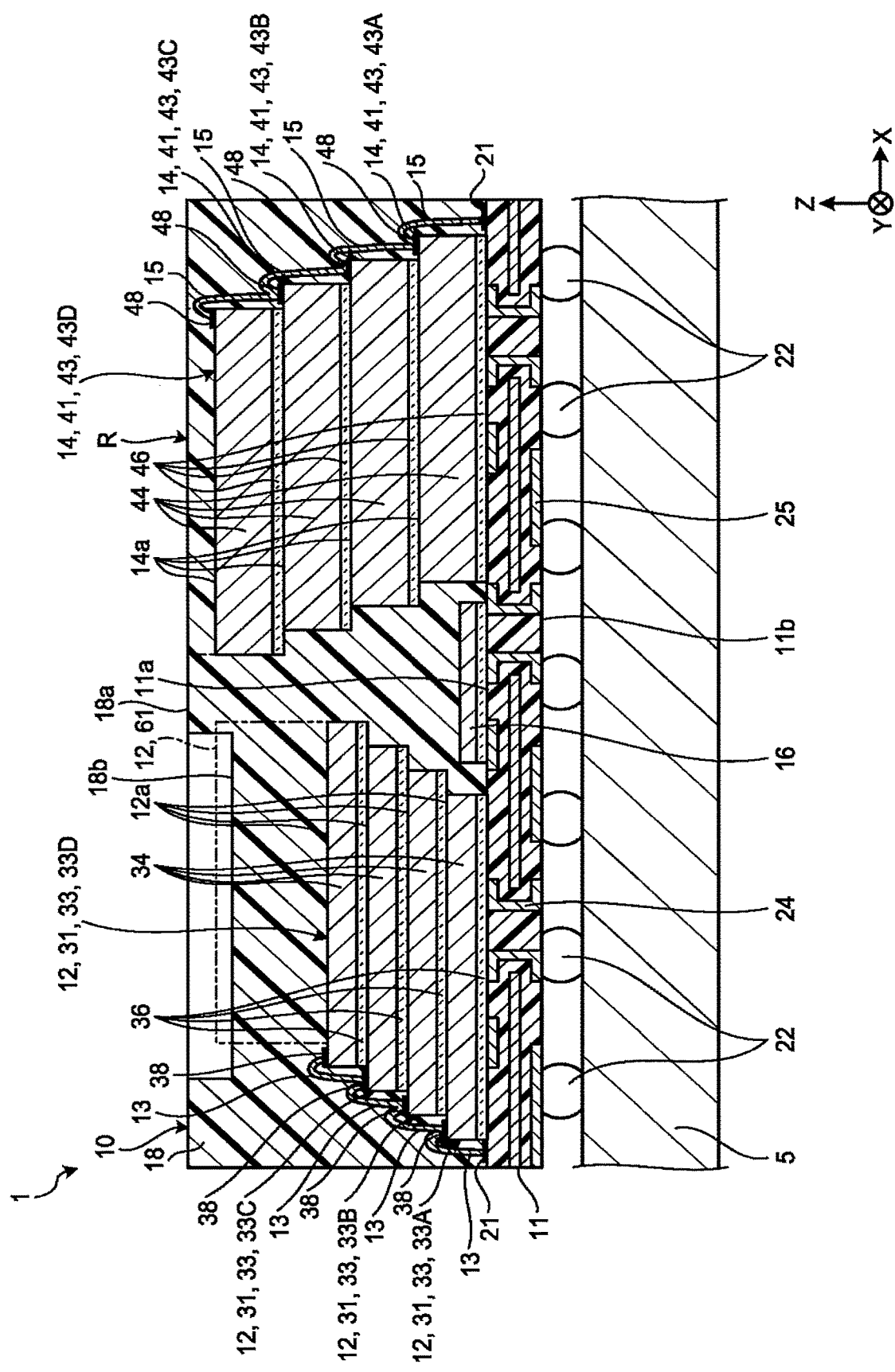
FIG. 7 is a cross-sectional view schematically illustrating part of an electronic apparatus according to a seventh embodiment.

A seventh embodiment is described below with reference to FIG. 7. FIG. 7 is a cross-sectional view schematically illustrating part of the electronic apparatus 1 according to the seventh embodiment. The seventh embodiment is different from the sixth embodiment in the thicknesses of the second chips 41.

As illustrated in FIG. 7, the thicknesses of the second memory chips 43A, 43B, 43C, and 43D are equal to one another. On the other hand, each of the second memory chips 43A, 43B, 43C, and 43D is thicker than each of the first memory chips 33A, 33B, 33C, and 33D. Consequently, in the semiconductor device 10 of the seventh embodiment, it is possible to reduce the types of the first chips 31 and the second chips 41, and reduce the cost of the semiconductor device 10.

Eighth Embodiment

Figure 8:
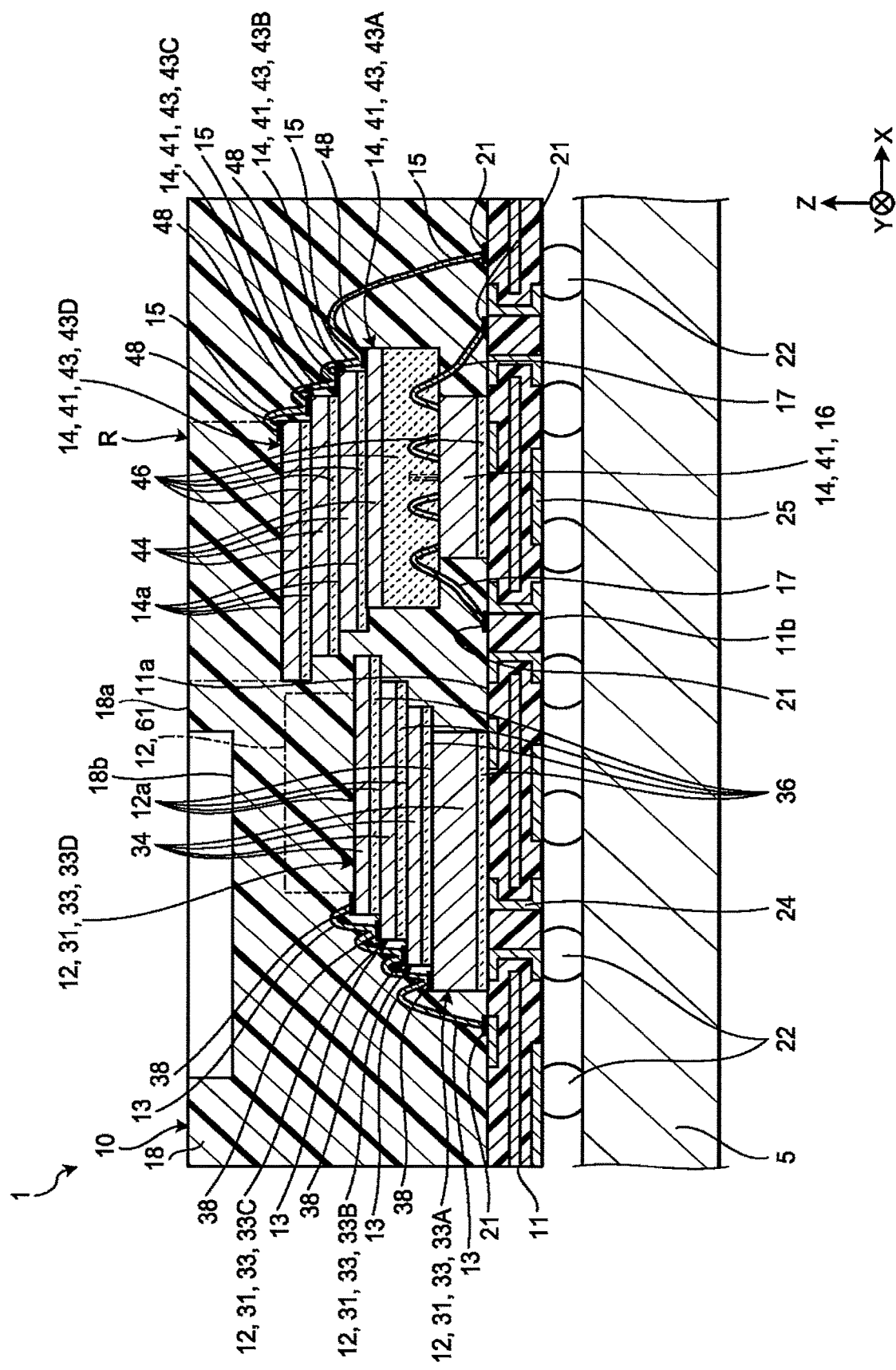
FIG. 8 is a cross-sectional view schematically illustrating part of an electronic apparatus according to an eighth embodiment.

An eighth embodiment is described below with reference to FIG. 8. FIG. 8 is a cross-sectional view schematically illustrating part of the electronic apparatus 1 according to the eighth embodiment. As illustrated in FIG. 8, the plurality of first stacked components 12 is equivalent to those of the second embodiment.

In the eighth embodiment, the controller chip 16 is included in the plurality of second chips 41. Five second chips 41 (second stacked components 14) including four second memory chips 43 and one controller chip 16 are stacked on the first surface 11a. Hence, the controller chip 16 includes the second top surface 14a, and is provided with the second bonding layer 46.

The controller chip 16 is mounted on the first surface 11a of the substrate 11. The second bonding layer 46 provided to the controller chip 16 bonds the controller chip 16 and the first surface 11a of the substrate 11 together.

The second bonding layer 46 provided to the second memory chip 43A bonds the second memory chip 43A and the second top surface 14a of the controller chip 16 together. The second bonding layer 46 provided to the second memory chip 43A is thicker than the second bonding layer 46 provided to the controller chip 16, and is thicker than the second bonding layer 46 provided to each of the second memory chips 43B, 43C, and 43D.

The plurality of third wires 17 connects the controller chip 16 and the plurality of pads 21 on the first surface 11a. At least one of the plurality of third wires 17 is partially embedded in the second bonding layer 46 provided to the second memory chip 43A. The third wire 17 is spaced apart from the second memory chip 43A.

The controller chip 16 and the plurality of third wires 17 may be embedded in the second bonding layer 46. Moreover, the controller chip 16 may be mounted on the first surface 11a of the substrate 11 by flip chip mounting.

In the eighth embodiment, the second memory chip 43D is partially overlapped with the first memory chip 33D in a plane view as seen from the positive direction of the Z-axis. The second memory chip 43D is spaced apart from the first memory chip 33D in the positive direction of the Z-axis.

In the semiconductor device 10 of the eighth embodiment described above, the plurality of first chips 31 includes the plurality of first memory chips 33. The plurality of second chips 41 includes the plurality of second memory chips 43 and the controller chip 16. In other words, the controller chip 16 and the plurality of second memory chips 43 are stacked. Accordingly, there is no need to arrange the controller chip 16 and the plurality of first stacked components 12 and the plurality of second stacked components 14 side by side in the direction intersecting with the positive direction of the Z-axis. The size of the semiconductor device 10 can be reduced in the direction intersecting with the positive direction of the Z-axis.

At least part of the third wire 17 connecting the controller chip 16 and the pad 21 is embedded in the second bonding layer 46. Consequently, it is possible to prevent the third wire 17 from interfering with another one of the plurality of second stacked components 14 and stack the controller chip 16 together with the plurality of second memory chips 43.

Ninth Embodiment

Figure 9:
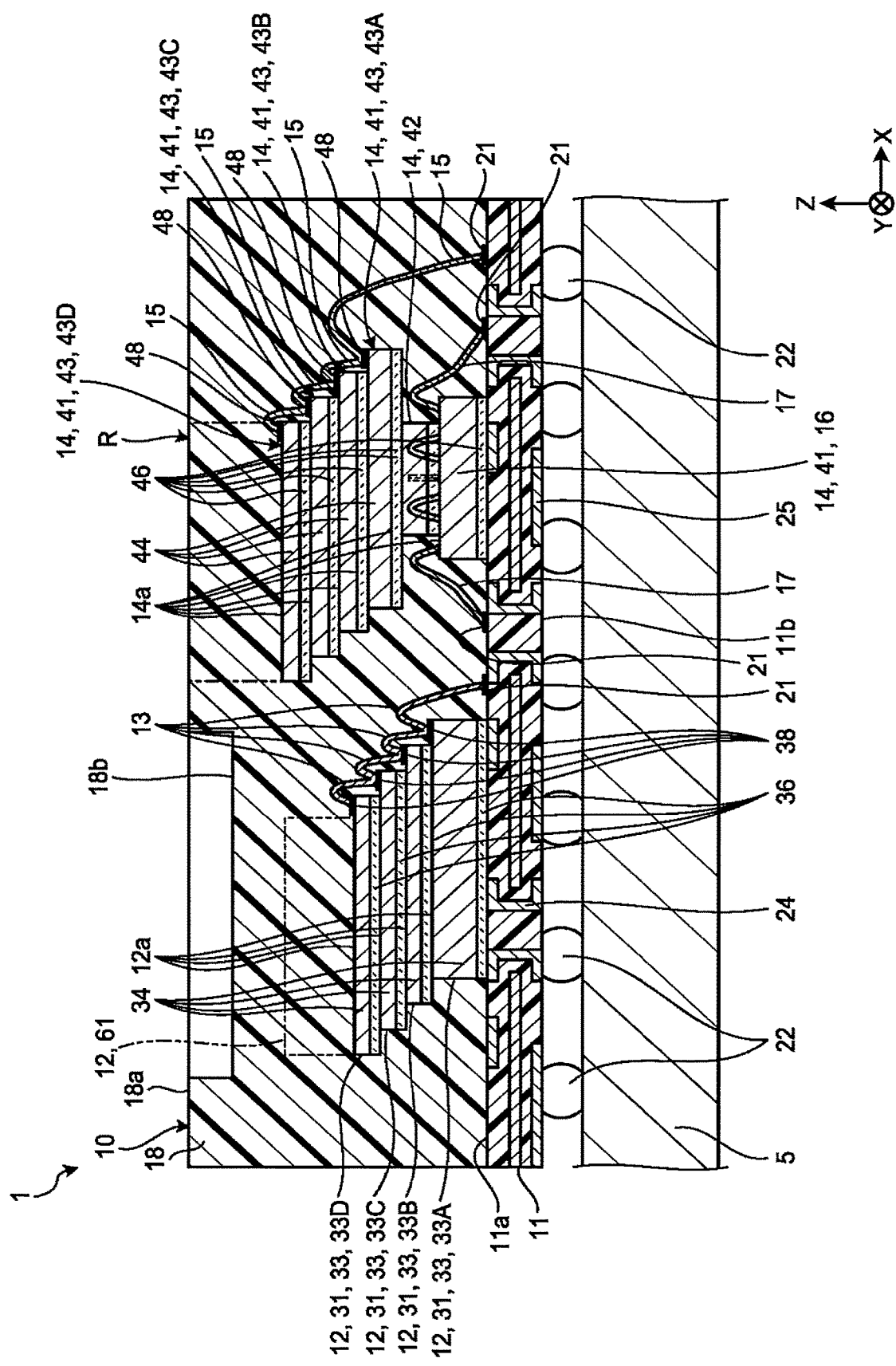
FIG. 9 is a cross-sectional view schematically illustrating part of an electronic apparatus according to a ninth embodiment.

A ninth embodiment is described below with reference to FIG. 9. FIG. 9 is a cross-sectional view schematically illustrating part f the electronic apparatus 1 according to the ninth embodiment. As illustrated in FIG. 9, the ninth embodiment is different from the eighth embodiment in the presence or absence of the spacer 42 and the orientation of the plurality of first stacked components 12.

In the ninth embodiment, the plurality of second chips 41 includes four second memory chips 43 and one controller chip 16 as in the eighth embodiment. Furthermore, in the ninth embodiment, the second stacked components 14 include the spacer 42. The spacer 42 is produced from silicon but may be produced from a synthetic resin.

The spacer 42 is located between the controller chip 16 and the second memory chip 43A. The second bonding layer 46 provided to the spacer 42 bonds the spacer 42 and the second top surface 14a of the controller chip 16 together. The second bonding layer 46 provided to the second memory chip 43A bonds the second memory chip 43A and the second top surface 14a of the spacer 42 together.

The spacer 42 is located between the plurality of third wires 17, and spaced apart from the plurality of third wires 17. The second top surface 14a of the spacer 42 is narrower than the second top surface 14a of the controller chip 16.

In the ninth embodiment, the second memory chip 43A is thicker than each of the second memory chips 43B, 43C, and 43D. For example, the thickness of the second memory chip 43A is set in such a manner as to stabilize the work of connecting the second wire 15 to the second terminal 48.

Moreover, in the ninth embodiment, the first terminal 38 is provided at an end of the first top surface 12a in the positive direction of the X-axis as in the second terminal 48. The plurality of first memory chips 33 is stacked in such a manner as to expose the first terminal 38. Hence, the plurality of first memory chips 33 is stacked in step form that increases in length in the negative direction of the X-axis with increasing number of the first memory chips 33.

In the semiconductor device 10 of the ninth embodiment described above, the spacer 42 is located between the controller chip 16 and the second memory chip 43A, and supports the second memory chip 43A. Consequently, there is no need to bury the third wire 17 in the second bonding layer 46. The control of the temperature of the second bonding layer 46 is facilitated.

The first terminal 38 is provided at an end of the first top surface 12a in the positive direction of the X-axis intersecting with the positive direction of the Z-axis. The second terminal 48 is also provided at an end of the second top surface 14a in the positive direction of the X-axis. Consequently, the plurality of first chips 31 and the plurality of second chips 41 are stacked stepwise in the same direction. Accordingly, interference between the plurality of first chips 31 and the plurality of second chips 41 is prevented.

Modification

The plurality of embodiments have been described above. However, as indicated by chain double-dashed lines in FIGS. 1 to 9, the plurality of first stacked components 12 may include a member 61. The first bonding layer 36 provided to the member 61 bonds the member 61 and the first memory chip 33D together. The first top surface 12a of the member 61 that is the farthest one of the plurality of first stacked components 12 away from the first surface 11a of the substrate 11 and the second top surface 14a of the second memory chip 43D that is the farthest one of the plurality of second stacked components 14 away from the first surface 11a are at the same position in the positive direction of the Z-axis.

The material of the member 61 is determined according to the coefficient of thermal expansion of the plurality of second stacked components 14 as a whole. For example, if the plurality of second stacked components 14 includes the spacer 42 produced from silicon, the member 61 is produced from silicon. Moreover, if the plurality of second stacked components 14 includes the spacer 42 produced from a synthetic resin, the member 61 is produced from a synthetic resin. Consequently, the coefficient of thermal expansion of the plurality of first stacked components 12 as a whole is equal or close to the coefficient of thermal expansion of the plurality of second stacked components 14 as a whole. Therefore, the semiconductor device 10 is prevented from deforming due to a difference in coefficient of thermal expansion.

In the semiconductor device 10 of the modification described above, the first top surface 12a of the member 61 that is the farthest away from the first surface 11a among the plurality of first stacked components 12 and the second top surface 14a of the second memory chip 43D that is the farthest away from the first surface 11a among the plurality of second stacked components 14 are at the same position in the positive direction of the Z-axis. In other words, the height of the plurality of first stacked components 12 and the height of the plurality of second stacked components 14 are the same. Therefore, a part where the plurality of first stacked components 12 are stacked and a part where the plurality of second stacked components 14 are stacked are equal or close in coefficient of thermal expansion. Accordingly, the semiconductor device 10 is prevented from deforming due to a difference in thermal expansion.

In the first to seventh embodiments and modification, which are described above, for example, the semiconductor device 10 may not include the controller chip 16. In this case, the first memory chips 33 and the second memory chips 43 of the semiconductor device 10 can be controlled by, for example, the controller chip 16 mounted on the circuit board 5.

According to at least one of the embodiments described above, the first top surface of one of the plurality of first chips, the one being the second farthest away from the surface, is at a different position in the first direction from the second top surface of one of the plurality of second chips, the one being the second farthest away from the surface. In other words, the position of the first chip that is the farthest from the surface and the position of the second chip that is the farthest from the surface can be made different in the first direction. Hence, the plurality of first chips and the plurality of second chips can be brought close to each other in a direction intersecting with the first direction while the distance between the first and second chips is ensured. Therefore, the size of the semiconductor device can be reduced in the direction intersecting with the first direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a substrate including a surface facing in a first direction, and a plurality of electrodes on the surface;
    a plurality of first stacked components including a plurality of first chips, the plurality of first stacked components being stacked on the surface;
    a plurality of first wires that connects the plurality of first chips and the plurality of electrodes;
    a plurality of second stacked components including a plurality of second chips, the plurality of second stacked components being stacked on the surface;
    a plurality of second wires that connects the plurality of second chips and the plurality of electrodes; and
    a coating resin that covers the surface, the plurality of first stacked components, the plurality of first wires, the plurality of second stacked components, and the plurality of second wires, wherein
    the plurality of first stacked components including the plurality of first chips each includes a first top surface facing in the first direction,
    the plurality of second stacked components including the plurality of second chips each includes a second top surface facing in the first direction,
    a distance between the surface and the second top surface of a farthest one of the plurality of second chips away from the surface is longer than a distance between the surface and the first top surface of a farthest one of the plurality of first chips away from the surface,
    the plurality of second stacked components include a first spacer between the surface and a nearest one of the plurality of second chips to the surface,
    the first spacer is not connected to the plurality of second wires,
    a thickness of the nearest one of the plurality of second chips to the surface is thicker than the farthest one of the plurality of second chips away from the surface, and
    a thickness of a nearest one of the plurality of first chips to the surface is thicker than the farthest one of the plurality of first chips away from the surface.

2. The semiconductor device according to claim 1, wherein the farthest one of the plurality of first chips away from the surface is overlapped with the farthest one of the plurality of second stacked components away from the surface in a plane view as seen from the first direction.

3. The semiconductor device according to claim 1, wherein
    the coating resin includes an outer surface that faces in the first direction and is provided with a recess that forms a mark,
    the recess is located on the outer surface outside a region lying over either of the first top surface and the second top surface in the first direction, whichever is farther from the surface, the first top surface being of a farthest one of the plurality of first stacked components away from the surface, and the second top surface being of a farthest one of the plurality of second stacked components away from the surface.

4. The semiconductor device according to claim 1, wherein
    the number of the plurality of second stacked components is more than the number of the plurality of first stacked components.

5. The semiconductor device according to claim 4, wherein
    the sum of the number of the plurality of first stacked components and the number of the plurality of second stacked components is an odd number.

6. The semiconductor device according to claim 1 further comprising
    a semiconductor chip mounted on the surface between the plurality of first stacked components and the plurality of second stacked components, wherein the semiconductor chip overlaps with both of a part of a second nearest one of the plurality of first stacked components to the surface and a part of a second nearest one of the plurality of second stacked components to the surface in a plane view as seen from the first direction.

7. The semiconductor device according to claim 1, wherein the plurality of first components include a second spacer between the surface and a nearest one of the plurality of first chips to the surface, and the second spacer is not connected to the plurality of first wires.

\* \* \* \* \*